United States Patent
Roberts et al.

(10) Patent No.: US 10,742,174 B2
(45) Date of Patent: Aug. 11, 2020

(54) BROADBAND POWER TRANSISTOR DEVICES AND AMPLIFIERS WITH INPUT-SIDE HARMONIC TERMINATION CIRCUITS AND METHODS OF MANUFACTURE

(71) Applicant: NXP USA, Inc., Austin, TX (US)

(72) Inventors: Jeffrey Spencer Roberts, Tempe, AZ (US); Ning Zhu, Chandler, AZ (US); Damon G. Holmes, Scottsdale, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/230,624

(22) Filed: Dec. 21, 2018

(65) Prior Publication Data

US 2020/0204119 A1 Jun. 25, 2020

(51) Int. Cl.
*H03F 1/02* (2006.01)
*H03F 1/42* (2006.01)
*H03F 1/56* (2006.01)
*H03F 3/195* (2006.01)
(Continued)

(52) U.S. Cl.
CPC ............. *H03F 1/0288* (2013.01); *H03F 1/42* (2013.01); *H03F 1/565* (2013.01); *H03F 3/195* (2013.01); *H03F 3/211* (2013.01); *H03H 11/28* (2013.01); *H03F 2200/225* (2013.01); *H03F 2200/36* (2013.01); *H03F 2200/451* (2013.01)

(58) Field of Classification Search
USPC .................... 330/302, 305, 307, 124 R, 295
See application file for complete search history.

(56) References Cited

U.S. PATENT DOCUMENTS

| 5,276,406 A | 1/1994 | Samay et al. |
| 5,532,647 A | 7/1996 | Kawakami et al. |
| 6,166,599 A | 12/2000 | Aparin et al. |

(Continued)

FOREIGN PATENT DOCUMENTS

CN  206041939 U  3/2017

OTHER PUBLICATIONS

U.S. Appl. No. 15/827,679 (NXP application filed Nov. 30, 2017).
U.S. Appl. No. 15/983,974, (NXP application filed May 18, 2018).
U.S. Appl. No. 15/984,137 (NXP application filed May 18, 2018).

*Primary Examiner* — Hieu P Nguyen
(74) *Attorney, Agent, or Firm* — Sherry W. Schumm

(57) ABSTRACT

Embodiments of RF amplifiers and RF amplifier devices include a transistor, a multiple-section bandpass filter circuit, and a harmonic termination circuit. The bandpass filter circuit includes a first connection node coupled to the amplifier input, a first inductive element coupled between the first connection node and a ground reference node, a first capacitance coupled between the first connection node and a second connection node, a second capacitance coupled between the second connection node and the ground reference node, and a second inductive element coupled between the second connection node and the transistor input. The harmonic termination circuit includes a third inductive element and a third capacitance connected in series between the transistor input and the ground reference node. The harmonic termination circuit resonates at a harmonic frequency of a fundamental frequency of operation of the RF amplifier.

20 Claims, 7 Drawing Sheets

(51) Int. Cl.
*H03F 3/21* (2006.01)
*H03H 11/28* (2006.01)

(56) References Cited

U.S. PATENT DOCUMENTS

| | | | |
|---|---|---|---|
| 7,511,575 | B2 | 3/2009 | Gotou et al. |
| 8,611,834 | B2 * | 12/2013 | Harris .................. H03F 1/56 |
| | | | 455/114.1 |
| 8,659,359 | B2 | 2/2014 | Ladhani et al. |
| 9,692,363 | B2 | 6/2017 | Zhu et al. |
| 9,923,526 | B1 | 3/2018 | Lembeye |
| 2007/0120606 | A1 | 5/2007 | Lee et al. |
| 2013/0106672 | A1 | 5/2013 | Tung et al. |
| 2014/0167863 | A1 | 6/2014 | Ladhani et al. |
| 2016/0126905 | A1 | 5/2016 | Zhao et al. |
| 2017/0117856 | A1 | 4/2017 | Zhu et al. |
| 2018/0248521 | A1 | 8/2018 | Min et al. |

* cited by examiner

BROADBAND POWER TRANSISTOR DEVICES AND AMPLIFIERS WITH INPUT-SIDE HARMONIC TERMINATION CIRCUITS AND METHODS OF MANUFACTURE

TECHNICAL FIELD

Embodiments of the subject matter described herein relate generally to radio frequency (RF) amplifiers, and more particularly to broadband power transistor devices and amplifiers, and methods of manufacturing such devices and amplifiers.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

In the field of power amplifier device design, it is becoming increasingly desirable to achieve concurrent multi-band, broadband amplification. To successfully design a wideband power amplifier device for concurrent multi-band, broadband operation in a Doherty power amplifier circuit, for example, it is desirable to enable a good broadband fundamental match (e.g., over 20 percent fractional bandwidth) to appropriately handle harmonic frequency interactions, and to enable a wide video bandwidth. However, achieving these goals continues to provide challenges to power amplifier device designers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
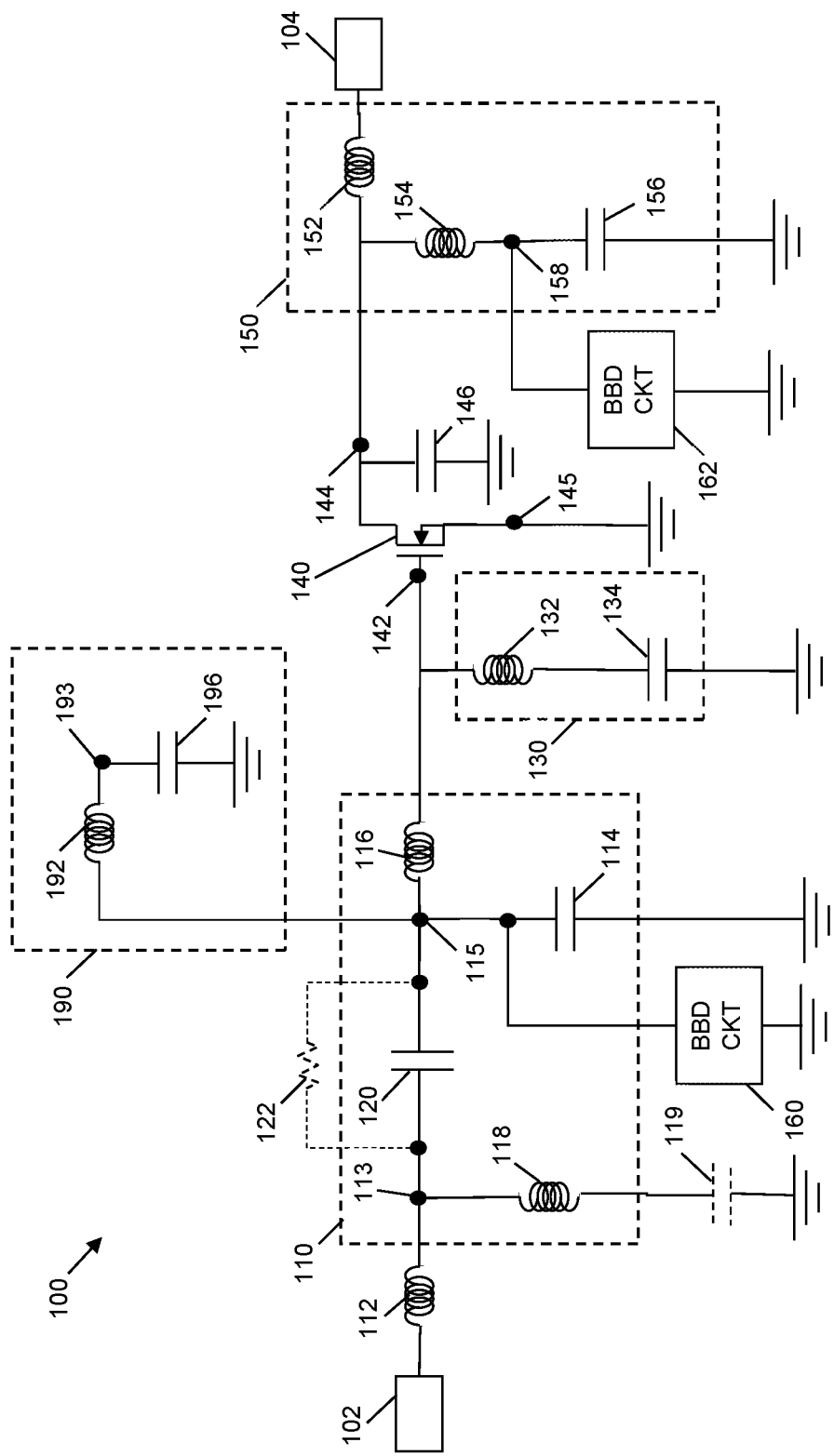
FIG. 1 is a schematic circuit diagram of a power amplifier circuit, in accordance with an example embodiment.

In the field of high-power radio frequency (RF) power amplification for cellular base stations and other applications, broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth).

For example, the nonlinear input capacitance of RF power devices that include GaN transistors are known to generate harmonics and intermodulation distortion that can impair efficiency and linearity. Second harmonic terminations also play an important role in the overall performance of a power amplifier design that uses GaN-based transistors. Without the information of second harmonic impedance at the current source terminal plane, it is very difficult to tune a power amplifier to achieve relatively high fractional bandwidth with good performance. Furthermore, the second harmonic termination may vary significantly across a large bandwidth for broadband applications, which further increases the difficulty of circuit tuning.

To overcome these and other challenges in designing broadband power amplifiers using GaN-based devices, embodiments disclosed herein may achieve broadband input impedance matching at fundamental frequency using a multiple-section (e.g., two-section) bandpass filter topology. An input-side harmonic termination circuit is added close to the gate terminal using a bondwire connection and an RF capacitor. Some specific embodiments of the inventive subject matter include input harmonic termination circuitry that includes an integrated capacitance (e.g., metal-insulator-metal (MIM) capacitor) and an inductance (e.g., in the form of a bondwire array) series-coupled between the transistor input and a ground reference. The harmonic termination circuitry embodiments may be used to control the second harmonic impedance across a wide (e.g., 20 percent plus) fractional bandwidth at relatively low impedance (e.g., close to short circuit). This may be useful in achieving relatively high efficiency for broadband applications.

A shunt capacitor in the input-side impedance matching circuit is desirably selected to be eligible for broadband impedance matching. More specifically, the shunt capacitor in the input-side impedance matching circuit has a high enough capacitance value (e.g., greater than 60 picofarads) to provide an acceptable RF low-impedance point (e.g., a quasi-RF cold-point). This RF low-impedance point represents a low impedance point in the circuit for RF signals. A baseband decoupling circuit with good RF isolation is connected to the quasi-RF cold-point.

FIG. 1 is a schematic diagram of an RF power amplifier circuit 100. Circuit 100 includes an input 102 (e.g., a first conductive package lead), an input impedance matching circuit 110, a harmonic termination circuit 130, a transistor 140, an output impedance matching circuit 150, baseband decoupling (BBD) circuits 160, 162 (also referred to as video bandwidth circuits), and an output lead 104 (e.g., a second conductive package lead), in an embodiment. Each of the input and output 102, 104 may be more generally referred to as an "RF input/output (I/O)."

The input impedance matching circuit 110, harmonic termination circuit 130, and baseband decoupling circuit 160 may be referred to collectively as an "input circuit." Similarly, the output impedance matching circuit 150 and baseband decoupling circuit 162 may be referred to collectively as an "output circuit." Although transistor 140 and various elements of the input and output impedance matching circuits 110, 150, the baseband decoupling circuits 160, 162, and the harmonic termination circuit 130 are shown as singular components, the depiction is for the purpose of ease of explanation only. Those of skill in the art would understand, based on the description herein, that transistor 140 and/or certain elements of the input impedance matching circuit 110, the harmonic termination circuit 130, the output impedance matching circuit 150, and the baseband decoupling circuits 160, 162 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 140 and various elements of the input impedance matching circuit 110, the harmonic termination circuit 130, the output impedance matching circuit 150, and the baseband decoupling circuits 160, 162, below, thus are not intended to limit the scope of the inventive subject matter only to the illustrated embodiments.

Input 102 and output 104 each may include a conductor, which is configured to enable the circuit 100 to be electrically coupled with external circuitry (not shown). More specifically, the input and output 102, 104 are physically positioned to span between the exterior and the interior of a device package, in an embodiment. Input impedance matching circuit 110, harmonic termination circuit 130, and baseband decoupling circuit 160, are electrically coupled between the input 102 and a first terminal 142 of transistor 140 (e.g., the gate terminal). Similarly, output impedance matching circuit 150 and baseband decoupling circuit 162 are electrically coupled between a second terminal 144 of transistor 140 (e.g., the drain terminal) and the output 104. A third terminal 145 of transistor 140 (e.g., the source terminal) is coupled to a ground reference node.

According to an embodiment, transistor 140 is the primary active component of circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate terminal (control terminal 142), a drain terminal (a first current conducting terminal 144), and a source terminal (a second current conducting terminal 145). According to an embodiment, and using nomenclature typically applied to FETs in a non-limiting manner, the gate terminal 142 of transistor 140 is coupled to the input impedance matching circuit 110, the harmonic termination circuit 130, and the baseband decoupling circuit 160, the drain terminal 144 of transistor 140 is coupled to the output impedance matching circuit 150 and the baseband decoupling circuit 162, and the source terminal 145 of transistor 140 is coupled to ground (or another voltage reference). Through the variation of control signals provided to the gate terminal of transistor 140, the current between the current conducting terminals of transistor 140 may be modulated.

According to various embodiments, transistor 140 is a III-V field effect transistor (e.g., a high electron mobility transistor (HEMT)), which has a relatively low drain terminal-source terminal capacitance, Cds, when compared with a silicon-based FET (e.g., an LDMOS FET). In FIG. 1, the drain terminal-source terminal capacitance of transistor 140 is represented with capacitor 146 between the drain terminal of transistor 140 and a transistor output terminal 144. More specifically, capacitor 146 is not a physical component, but instead models the drain terminal-source terminal capacitance of transistor 140. According to an embodiment, transistor 140 may have a drain terminal-source terminal capacitance that is less than about 0.2 pF/W. Further, in some embodiments, transistor 140 may be a GaN FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a relatively low drain terminal-source terminal capacitance.

As mentioned above, the input impedance matching circuit 110, harmonic termination circuit 130, and baseband decoupling circuit 160, are electrically coupled between the input 102 and a first terminal 142 of transistor 140 (e.g., the gate terminal). According to one embodiment, a first inductive element 112 (e.g., a first set of bondwires) is coupled between input 102 and the input impedance matching circuit 110. More specifically, the first inductive element 112 is coupled between the input 102 and a first node 113 (also referred to as a "connection node"), which essentially corresponds to an input of the input impedance matching circuit 110. Besides functioning to make the electrical connection between the input 102 and the input impedance matching circuit 110, the first inductive element 112 also may add reactance to a final transformed impedance provided by the input impedance matching circuit 110.

The input impedance matching circuit 110 is coupled between connection node 113 and the control terminal 142 (e.g., gate terminal) of the transistor 140. Input impedance matching circuit 110 is configured to transform (e.g., raise) the gate impedance of transistor 140 to a higher (e.g., intermediate or higher) impedance level (e.g., in a range from about 2 to about 10 ohms or higher) at node 102. This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 has a two-section bandpass filter configuration, which includes a series inductive element 116, a series capacitance 120, a shunt inductive element 118, and a shunt capacitance 114. According to an embodiment, series inductive element 116 and shunt capacitance 114 form a low-pass filter of the bandpass filter configuration, and shunt inductive element 118 and series capacitance 120 form a high pass filter of the bandpass filter configuration. The bandpass configuration allows for wideband operation at RF frequencies that would not be as easily achieved with simpler matching networks.

Series capacitance 120 and a series inductive element 116 (e.g., a second set of bondwires) are coupled in series between input 102 (or more specifically inductance 112 or connection node 113) and the control terminal 142 of transistor 140. More specifically, a first terminal of the series capacitance 120 is coupled to the first node 113, a second terminal of the series capacitance 120 is coupled to a second node 115 (also referred to as a "connection node"), and the series inductive element 116 is coupled between the second node 115 and the control terminal 142 of transistor 140.

Shunt inductive element 118 is coupled between the first node 113 and ground (or another voltage reference). As will be described in more detail later, in an embodiment in which a DC gate bias is provided through input 102, rather than through the below-described gate terminal bias circuit 190, a DC blocking capacitor 119 may be connected in series with the third inductive element 118. A first terminal of shunt capacitance 114 is coupled to the second node 115, and a second terminal of shunt capacitance 114 is coupled to ground (or another voltage reference).

According to an embodiment, inductive element 112 may have an inductance value in a range between about 150 picohenries (pH) to about 400 pH, inductive element 116 may have an inductance value in a range between about 80 pH to about 250 pH, shunt inductance 118 may have an inductance value in a range between about 100 pH to about 350 pH, series capacitance 120 may have a capacitance value in a range between about 25 picofarads (pF) to about 50 pF, and shunt capacitance 114 may have a capacitance value in a range between about 60 pF to about 200 pF. Desirably, shunt capacitance 114 has a relatively-large capacitance (e.g., greater than about 60 pF) to provide an acceptable RF low-impedance point at node 115. In other embodiments, some or all of the above-listed components may have smaller or larger component values than the above-given ranges.

According to an embodiment, harmonic termination circuit 130 is coupled between the control terminal 142 (e.g., gate terminal) of transistor 140 and ground (or another voltage reference). Harmonic termination circuit 130 includes inductive element 132 (e.g., a third set of bondwires) and capacitance 134 coupled in series between the control terminal 142 of transistor 140 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 132 may have an inductance value in a range between about 100 pH to about 1 nH, and capacitance 134 may have a capacitance value in a range between about 1 pF to about 100 pF, although these components may have values outside of these ranges, as well. For example, at an example fundamental frequency of operation of 2.0 gigahertz (GHz), which has a second harmonic at 4.0 GHz, inductive element 132 may have an inductance value of about 120 pH, and capacitance 134 may have a capacitance value of about 12 pF. As will be explained later, the desired inductance and/or capacitance values used to achieve a low impedance path to ground for signal energy at the second harmonic frequency may be affected by mutual coupling between bondwires used to implement inductors 116 and 132.

Desirably, shunt capacitance 114 has a relatively-large capacitance (e.g., greater than about 60 pF) to provide an RF low-impedance point at node 115. In other words, node 115 represents a low impedance point in the circuit for RF signals. According to an embodiment, a first (in-package) baseband decoupling (BBD) circuit 160 is coupled between node 115 (e.g., or another RF low-impedance point at or coupled to node 115) and the ground reference node. The first baseband decoupling circuit 160 may function to improve the low frequency resonance (LFR) of circuit 100 caused by the interaction between the input matching circuit 110 and the bias feeds (not shown) by presenting a low impedance at envelope frequencies and/or a high impedance at RF frequencies. The first baseband decoupling circuit 160 essentially may be considered to be "invisible" from an RF matching standpoint, as it primarily effects the impedance at envelope frequencies (i.e., baseband decoupling circuit 160 provides terminations for the envelope frequencies of circuit 100). As will be discussed in more detail later in conjunction with FIGS. 2A-2F, the first baseband decoupling circuit 160 may have any of a number of different circuit configurations, in various embodiments.

Amplifier circuit 100 also may include gate terminal bias circuit 190 coupled to node 115, in an embodiment, which may function as a second (out-of-package) baseband decoupling circuit that is essentially coupled in parallel with the first baseband decoupling circuit 160. A similarly (or differently) configured drain terminal bias circuit (not shown) may be coupled to node 158. Bias circuit 190 includes a series-coupled inductive element 192 (e.g., one or more bondwires 592, FIG. 5, coupled in series with a bias lead 492, FIG. 4) and capacitor 196, with an intermediate node 193 between the inductor/capacitor combination. According to an embodiment, inductive element 192 may have an inductance value in a range between about 1500 pH to about 2500 pH, and capacitor 196 may have a capacitance value in a range between about 8,000 nanofarads (nF) to about 12,000 nF, although the inductance and/or capacitance values could be lower or higher, as well.

To provide a gate bias voltage to the gate terminal 142 of the transistor 140, an external bias circuit (not shown) may be connected to node 193 (e.g., the distal end of a bias lead), and the bias voltage may be provided through this node. A drain bias voltage may be similarly provided to node 158.

In other embodiments, either or both the input-side or output-side bias circuits may be excluded. In such embodiments, the external bias circuits may be connected instead to the input 102 or to the output 104, and the bias voltage(s) may be provided through the input 102 and/or the output 104. For example, in an embodiment in which the gate bias is provided through the input 102, circuit 100 also includes a resistor 122 coupled in parallel with capacitance 120 between nodes 113 and 115, and a DC blocking capacitor 119 in series with inductance 118. When included, resistor 122 and DC blocking capacitor 119 each are configured to provide high impedance at RF frequencies. According to an embodiment, resistor 122 may have a resistance value in a range of about 50 ohms to about 150 ohms, and DC blocking capacitor 119 may have a capacitance value in a range of about 50 pF to about 300 pF, although the resistance and capacitance values of these components could be lower or higher, as well. Although FIG. 1 illustrates the third inductive element 118 and the DC blocking capacitor 119 in a particular series arrangement (e.g., with the third inductive element 118 directly connected to node 113), in other embodiments, the order of the third inductive element 118 and the DC blocking capacitor 119 could be reversed (e.g., with the DC blocking capacitor 119 directly connected to node 113, as is the case in the integrated passive device 500 illustrated in FIG. 5, and described in detail below). Again, and as indicated by depicting resistor 122 and DC blocking capacitor 119 with dashed lines, resistor 122 and DC blocking capacitor 119 may be excluded from circuit 100 in an embodiment in which the gate bias voltage is provided through gate terminal bias circuit 190.

On the output side of the circuit 100, output impedance matching circuit 150 is coupled between the first current conducting terminal 144 (e.g., drain terminal) of transistor 140 and the output 104. Output impedance matching circuit 150 is configured to match the output impedance of circuit 100 with the input impedance of an external circuit or component (not shown) that may be coupled to output 104.

Output impedance matching circuit 150 may have any of a number of different circuit configurations, and just one example is shown in FIG. 1. More specifically, in the non-limiting example shown in FIG. 1, output impedance matching circuit 150 includes two inductive elements 152, 154 and shunt capacitance 156. A first inductive element 152 (e.g., a fourth set of bondwires) is coupled between the first current conducting terminal 144 (e.g., drain terminal) of transistor 140 and the output 104. A second inductive element 154 (e.g., a fifth set of bondwires) is coupled between the first current conducting terminal 144 of transistor 140 and a node 158, which corresponds to another RF low-impedance point, in an embodiment. A second terminal of the shunt capacitance 156 is coupled to ground (or to another voltage reference), in an embodiment.

Again, the RF low-impedance point 158 represents a low impedance point in the circuit for RF signals. According to an embodiment, another baseband decoupling circuit 162 is coupled between the RF low-impedance point 158 and the ground reference node. Again, baseband decoupling circuit 162 may function to further improve the LFR of circuit 100 caused by the interaction between the output impedance matching circuit 150 and the bias feeds (not shown) by presenting a low impedance at envelope frequencies and/or a high impedance at RF frequencies. Baseband decoupling circuit 162 also may be considered to be "invisible" from an RF matching standpoint.

As will now be described in conjunction with FIGS. 2A-2F, the baseband decoupling circuits 160, 162 may have any of a number of different circuit configurations, in various embodiments. For example, FIGS. 2A-2F illustrate six example embodiments of baseband decoupling circuits (e.g., baseband decoupling circuits 160, 162, FIG. 1). In each of FIGS. 2A-2F, baseband decoupling circuit 200, 201, 202, 203, 204, 205 is coupled between a connection node 215 (e.g., node 115 and/or node 158, FIG. 1) and ground (or another voltage reference). Further, each baseband decoupling circuit 200-205 includes an envelope inductance 262, $L_{env}$, an envelope resistor 264, Renv, and an envelope capacitor 266, Cenv, coupled in series between the connection node 215 and ground. In each of FIGS. 2A-2E, a first terminal of envelope inductance 262 is coupled to node 215, and a second terminal of envelope inductance 262 is coupled to node 280. A first terminal of envelope resistor 264 is coupled to node 280, and a second terminal of envelope resistor 264 is coupled to node 282. A first terminal of envelope capacitor 266 is coupled to node 282, and a second terminal of the envelope capacitor 266 is coupled to ground (or another voltage reference). Although the order of the series of components between node 215 and the ground reference node is the envelope inductance 262, the envelope resistor 264, and the envelope capacitor 266 in FIGS. 2A-2E, the order of components in the series circuit could be different, in other embodiments. For example, in FIG. 2F, the envelope resistor 264 is coupled between node 215 and a node 284, the envelope inductance 262 is coupled between node 284 and a node 286, and the envelope capacitor 266 is coupled between node 286 and ground (or another voltage reference).

Referring to FIGS. 2A-2F, and according to an embodiment, the envelope inductance 262, may be implemented as an integrated inductance (e.g., inductance 562, FIG. 5), as a discrete inductor, and/or as a set of bondwires coupling the connection node 215 to the envelope resistor 264 (e.g., via node 280). For example, and as will be described in detail later, envelope inductance 262 may be integrally formed as a portion of an integrated passive device (IPD), such as IPD 480-483, FIGS. 4-6. For example, envelope inductance 262 may have an inductance value in a range between about 5 pH to about 2000 pH. Desirably, envelope inductance 262 has an inductance value less than about 500 pH (e.g., as low as 50 pH, in an embodiment, or possibly even lower). In other embodiments, the value of envelope inductance 262 may be lower or higher than the above-given range.

Envelope resistor 264 may be implemented as an integrated resistor (e.g., resistor 564, FIG. 5), in an embodiment, or as a discrete resistor, in another embodiment. For example, envelope resistor 264 may be integrally formed as a portion of an IPD, such as IPD 480-483, FIGS. 4-6. In some instances, envelope capacitor 266 and envelope inductor 262 may provide additional parasitic resistance which can be considered part of the overall resistance that forms envelope resistor 264. In an embodiment, envelope resistor 264 may have a resistance value in a range between about 0.1 ohm to about 5.0 ohm, although envelope resistor 264 may have a resistance value outside of this range, as well.

Envelope capacitor 266 may be implemented as an integrated capacitor (e.g., capacitor 566, FIG. 5), in an embodiment, or as a discrete capacitor (e.g., a "chip capacitor"), in another embodiment. For example, envelope capacitor 266 may be integrally formed as a portion of an IPD, such as IPD 480-483, FIGS. 4-6. In an embodiment, envelope capacitor 266 may have a capacitance value in a range between about 1 nF to about 1 microfarad (µF), although envelope capacitor 266 may have a capacitance value outside of this range, as well.

Figure 2A:
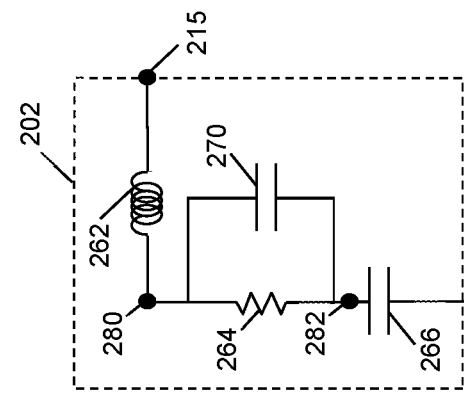
FIGS. 2A-2F illustrate various example embodiments of baseband decoupling circuits.

The first embodiment of baseband decoupling circuit 200 illustrated in FIG. 2A includes a simple series combination of envelope inductance 262, envelope resistor 264, and envelope capacitor 266. Conversely, in the embodiments of FIGS. 2B-2F, the baseband decoupling circuit 201-205 may include one or more "bypass" or "parallel" capacitors 268, 270, 272, 274, 276, 278, $C_{para}$, which are coupled in parallel with the envelope inductance 262 and/or the envelope resistor 264. Each of the bypass capacitors 268, 270, 272, 274, 276, 278 may be implemented as a discrete capacitor (e.g., capacitor 578, FIGS. 5, 6), in some embodiments, or as an integrated capacitor, in other embodiments. In each of these embodiments, a bypass capacitor 268, 270, 272, 274, 276, 278 may have a capacitance value in a range between about 3.0 pF to about 1400 pF. In other embodiments, the value of any of bypass capacitors 268, 270, 272, 274, 276, 278 may be lower or higher than the above-given range.

Figure 2B:
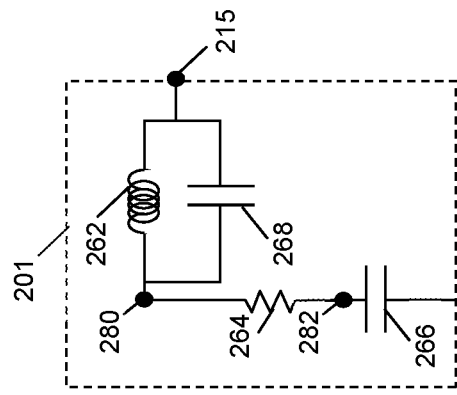

In the baseband decoupling circuit 201 of FIG. 2B, bypass capacitor 268, $C_{para}$, is coupled in parallel with the envelope inductance 262. More specifically, first terminals of envelope inductance 262 and bypass capacitor 268 are coupled to node 215, and second terminals of envelope inductance 262 and bypass capacitor 268 are coupled to node 280.

Figure 2C:
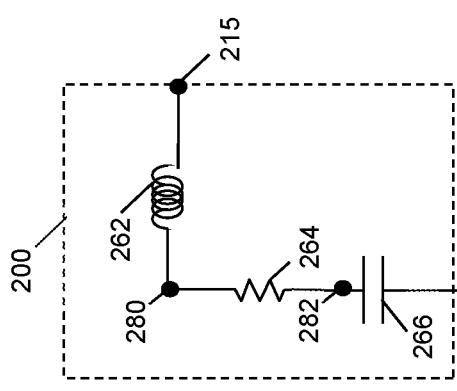

In the baseband decoupling circuit 202 of FIG. 2C, bypass capacitor 270, $C_{para}$, is coupled in parallel with the envelope resistor 264. More specifically, first terminals of envelope resistor 264 and bypass capacitor 270 are coupled to node 280, and second terminals of envelope resistor 264 and bypass capacitor 270 are coupled to node 282.

Figure 2D:
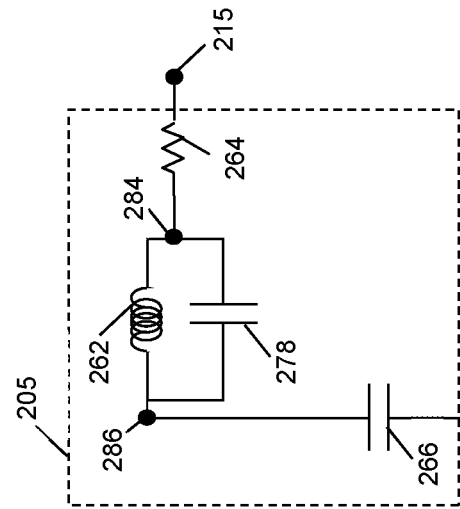

In the baseband decoupling circuit 203 of FIG. 2D, bypass capacitor 272, $C_{para}$, is coupled in parallel with the envelope inductance 262 and envelope resistor 264. More specifically, bypass capacitor 272 is coupled across nodes 215 and 282.

Figure 2E:
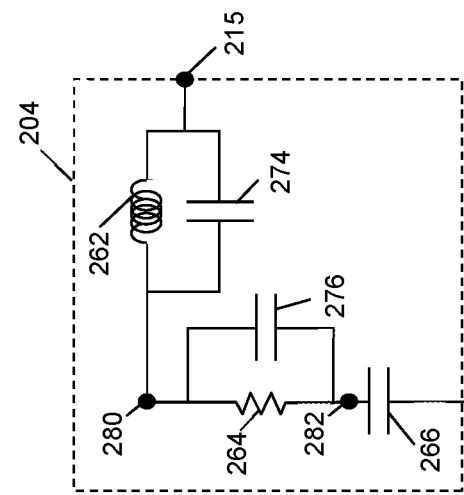

In the baseband decoupling circuit 204 of FIG. 2E, a first bypass capacitor 274, $C_{para1}$, is coupled in parallel with the envelope inductance 262, and a second bypass capacitor 276, $C_{para2}$, is coupled in parallel with the envelope resistor 264. More specifically, first terminals of envelope inductance 262 and first bypass capacitor 274 are coupled to node 215, and second terminals of envelope inductance 262 and first bypass capacitor 274 are coupled to node 280. In addition, first terminals of envelope resistor 264 and second bypass capacitor 276 are coupled to node 280, and second terminals of envelope resistor 264 and second bypass capacitor 276 are coupled to node 282.

Figure 2F:
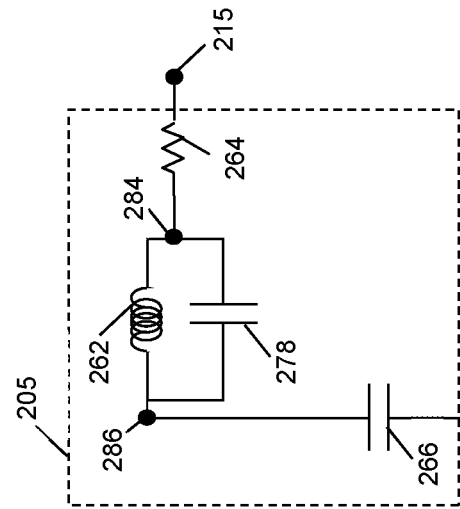

Referring to the baseband decoupling circuits 201, 204, and 205 of FIGS. 2B, 2E, and 2F, parallel-coupled inductance 262 and capacitor 268, 274 or 278 form a parallel resonant circuit at frequencies in proximity to the center operational frequency of the device or circuit (e.g., circuit 100) within which circuit 201, 204 or 205 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}/C_{para}$ form a parallel resonant circuit at frequencies in proximity to the center operational frequency of the device, the parallel resonant circuit $L_{env}/C_{para}$ essentially appears as an open circuit to such frequencies. Accordingly, RF energy near the center operational frequency that may be present at the node 215 to which circuit 201, 204 or 205 is coupled will be deflected by the parallel resonant circuit $L_{env}/C_{para}$. This deflection may be provided even using a relatively low inductance value for inductance 262. For these reasons, circuits 201, 204, and 205 may significantly improve the LFR of a device or circuit (e.g., circuit 100) in which it is incorporated by presenting a low impedance at envelope frequencies and a high impedance at RF frequencies.

In each of the embodiments of baseband decoupling circuits 202, 203, 204 of FIGS. 2C, 2D, and 2E, bypass capacitor 270, 272 or 276 is coupled in parallel with envelope resistor 264. Because capacitor 270, 272 or 276 may function to route RF current around the envelope resistor 264, circuits 202, 203, 204 may result in a reduction in the RF current dissipated by the envelope resistor 264. This characteristic of circuits 202, 203, 204 also may serve to better protect the envelope resistor 264 from potential compromise due to excessive current that may otherwise flow through the envelope resistor 264 in the absence of bypass capacitor 270, 272 or 276.

Each of circuits 201-205 may increase the device efficiency, when compared with circuit 200, since they allow less RF current to flow through (and be dissipated by) the envelope resistor 264. Further, because circuits 201-205 present a high impedance to RF frequencies in proximity to the center operational frequency of a device into which the baseband decoupling circuit is incorporated, it is not as important for circuits 201-205 to be connected to an RF low-impedance point (e.g., RF low-impedance point 115 or 158, FIG. 1), although they may be. Instead, the benefits of circuits 201-205 may be achieved even when circuits 201-205 are coupled to a node that shows higher RF impedance. This includes other nodes in both the input and output impedance matching circuits.

Referring again to FIG. 1, and as will be described in more detail later in conjunction with FIGS. 4-6, various embodiments of RF amplifier devices may include at least one input-side integrated passive device (IPD) assembly (e.g., IPD assemblies 480, 481, FIGS. 4-6), and at least one output-side IPD assembly (e.g., IPD assemblies 482, 483, FIG. 4). The input-side IPD assembly(ies) (e.g., IPD assemblies 480, 481) include portions of the input circuit 110, the harmonic termination circuit 130, and the baseband decoupling circuit 160. Similarly, the output-side IPD assembly (ies) (e.g., IPD assemblies 482, 483) include portions of the output circuit 150 and the baseband decoupling circuit 162. More specifically, each IPD assembly may include a semiconductor substrate with one or more integrated passive components. In a particular embodiment, each input-side IPD assembly may include shunt capacitances 114 and 134, and components of baseband decoupling circuit 160 (e.g., components 262, 264, 266, 268, 270, 272, 274, 276, 278, FIGS. 2A-2F). In other particular embodiments, each output-side IPD assembly may include shunt capacitance 156, and components of baseband decoupling circuit 162 (e.g., components 262, 264, 266, 268, 270, 272, 274, 276, 278, FIGS. 2A-2F).

In other embodiments, some portions of the input and output impedance matching circuits 110, 150 and baseband decoupling circuits 160, 162 may be implemented as distinct/discrete components or as portions of other types of assemblies (e.g., a low-temperature co-fired ceramic (LTCC) device, a small PCB assembly, and so on). In still other embodiments, some portions of the input and/or output impedance matching circuits 110, 150 may be coupled to and/or integrated within the semiconductor die that includes transistor 140. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

The RF amplifier circuit 100 of FIG. 1 may be utilized as a single-path amplifier, which receives an RF signal at input 102, amplifies the signal through transistor 140, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 3:
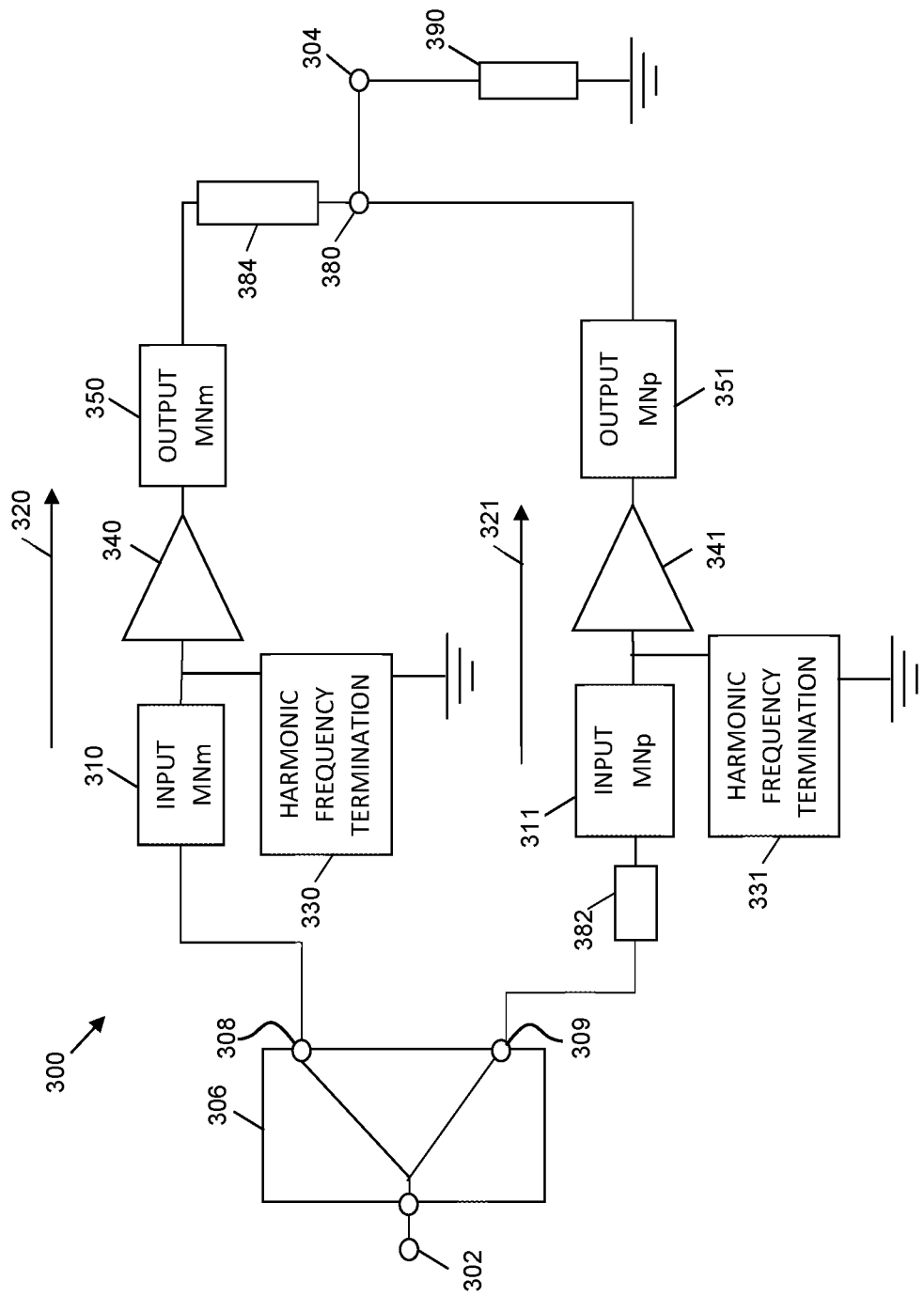
FIG. 3 is a simplified schematic diagram of a Doherty power amplifier, in accordance with an example embodiment.

For example, FIG. 3 is a simplified schematic diagram of a Doherty power amplifier 300 in which embodiments of RF power amplifier circuit 100 may be implemented. Amplifier 300 includes an input node 302, an output node 304, a power divider 306 (or splitter), a main amplifier path 320, a peaking amplifier path 321, and a combining node 380. A load 390 may be coupled to the combining node 380 (e.g., through an impedance transformer, not shown) to receive an amplified RF signal from amplifier 300.

Power divider 306 is configured to divide the power of an input RF signal received at input node 302 into main and peaking portions of the input signal. The main input signal is provided to the main amplifier path 320 at power divider output 308, and the peaking input signal is provided to the peaking amplifier path 321 at power divider output 309. During operation in a full-power mode when both the main and peaking amplifiers 340, 341 are supplying current to the load 390, the power divider 306 divides the input signal power between the amplifier paths 320, 321. For example, the power divider 306 may divide the power equally, such that roughly one half of the input signal power is provided to each path 320, 321 (e.g., for a symmetric Doherty amplifier configuration). Alternatively, the power divider 306 may divide the power unequally (e.g., for an asymmetric Doherty amplifier configuration).

Essentially, the power divider 306 divides an input RF signal supplied at the input node 302, and the divided signals are separately amplified along the main and peaking amplifier paths 320, 321. The amplified signals are then combined in phase at the combining node 380. It is important that phase coherency between the main and peaking amplifier paths 320, 321 is maintained across a frequency band of interest to ensure that the amplified main and peaking signals arrive in phase at the combining node 380, and thus to ensure proper Doherty amplifier operation.

Each of the main amplifier 340 and the peaking amplifier 341 includes one or more single-stage or multiple-stage power transistor integrated circuits (ICs) (or power transistor die) for amplifying an RF signal conducted through the amplifier 340, 341. According to various embodiments, all amplifier stages or a final amplifier stage of either or both the main amplifier 340 and/or the peaking amplifier 341 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 340 or the peaking amplifier 341 is implemented as a III-V FET, the other amplifier may be implemented as a silicon-based FET (e.g., an LDMOS FET), in some embodiments.

Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 300, the main amplifier 340 is biased to operate in class AB mode, and the peaking amplifier 341 is biased to operate in class C mode. At low power levels, where the power of the input signal at node 302 is lower than the turn-on threshold level of peaking amplifier 341, the amplifier 300 operates in a low-power (or back-off) mode in which the main amplifier 340 is the only amplifier supplying current to the load 390. When the power of the input signal exceeds a threshold level of the peaking amplifier 341, the amplifier 300 operates in a high-power mode in which the main amplifier 340 and the peaking amplifier 341 both supply current to the load 390. At this point, the peaking amplifier 341 provides active load modulation at combining node 380, allowing the current of the main amplifier 340 to continue to increase linearly.

Input and output impedance matching networks 310, 350 (input MNm, output MNm) may be implemented at the input and/or output of the main amplifier 340. Similarly, input and output impedance matching networks 311, 351 (input MNp, output MNp) may be implemented at the input and/or output of the peaking amplifier 341. In each case, the matching networks 310, 311, 350, 351 may be used to transform the gate and drain impedances of main amplifier 340 and peaking amplifier 341 to a more desirable system level impedance, as well as manipulate the signal phases to ensure proper Doherty amplifier operation. All or portions of the input and output impedance matching networks 310, 311, 350, 351 may be implemented inside a power transistor package that includes the main and/or peaking amplifiers 340, 341, or some portions of the input and output impedance matching networks 310, 311, 350, 351 may be implemented on a PCB or other substrate to which a power transistor package is mounted.

In addition, as will be described in detail later, embodiments of the inventive subject matter include harmonic frequency termination circuits 330, 331 coupled between the inputs of amplifiers 340, 341 and a ground reference. The harmonic frequency termination circuits 330, 331 are configured to control the harmonic impedance across a relatively wide fractional bandwidth. For example, the harmonic frequency termination circuits 330, 331 may provide a low impedance path to ground for signal energy at the second harmonic of the center frequency of operation, fo, of the amplifier 300 (also referred to herein as the "fundamental frequency" of operation).

Doherty amplifier 300 has a "non-inverted" load network configuration. In the non-inverted configuration, the input circuit is configured so that an input signal supplied to the peaking amplifier 341 is delayed by 90 degrees with respect to the input signal supplied to the main amplifier 340 at the center frequency of operation, fo, of the amplifier 300. To ensure that the main and peaking input RF signals arrive at the main and peaking amplifiers 340, 341 with about 90 degrees of phase difference, as is fundamental to proper Doherty amplifier operation, phase delay element 382 applies about 90 degrees of phase delay to the peaking input signal. For example, phase delay element 382 may include a quarter wave transmission line, or another suitable type of delay element with an electrical length of about 90 degrees.

To compensate for the resulting 90 degree phase delay difference between the main and peaking amplifier paths 320, 321 at the inputs of amplifiers 340, 341 (i.e., to ensure that the amplified signals arrive in phase at the combining node 380), the output circuit is configured to apply about a 90 degree phase delay to the signal between the output of main amplifier 340 and the combining node 380. This is achieved through an additional delay element 384. Alternate embodiments of Doherty amplifiers may have an "inverted" load network configuration. In such a configuration, the input circuit is configured so that an input signal supplied to the main amplifier 340 is delayed by about 90 degrees with respect to the input signal supplied to the peaking amplifier 341 at the center frequency of operation, fo, of the amplifier 300, and the output circuit is configured to apply about a 90 degree phase delay to the signal between the output of peaking amplifier 341 and the combining node 380.

Amplifiers 340 and 341, along with harmonic frequency termination circuits 330, 331 and portions of matching networks 310, 311, 350, 351 may be implemented in discrete, packaged power amplifier devices. In such devices, input and output leads are coupled to a substrate, and each amplifier 340, 341 may include a single-stage or multi-stage power transistor also coupled to the substrate. Portions of the harmonic frequency termination circuits 330, 331 and the input and output matching networks 310, 311, 350, 351 may be implemented as additional components within the packaged device. Further, as is described in detail below, the baseband decoupling circuits (e.g., embodiments of VBW circuits 160, 162, FIG. 1, illustrated in FIGS. 2A-2F) also may be implemented as additional components within the packaged device.

Figure 4:
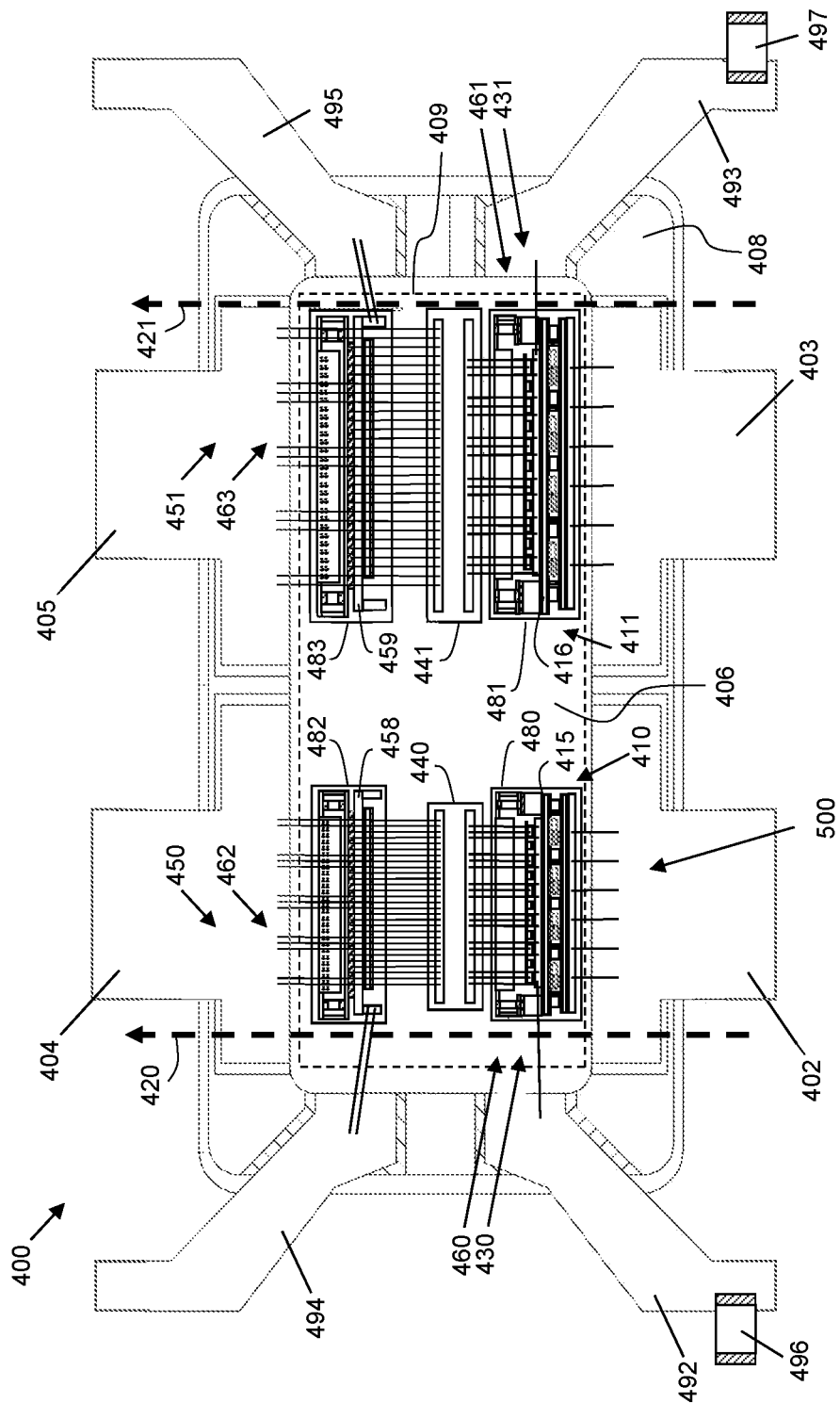
FIG. 4 is a top view of a packaged RF power amplifier device that includes two parallel amplification paths, in accordance with an example embodiment.

For example, FIG. 4 is a top view of an embodiment of a packaged RF amplifier device 400 that embodies two parallel instances of the circuit 100 of FIG. 1, and which may be utilized to provide amplifiers (e.g., amplifiers 340, 341, FIG. 3), and portions of matching networks (e.g., portions of matching networks 310, 311, 350, 351, FIG. 3) in a Doherty amplifier (e.g., Doherty amplifier 300, FIG. 3). In addition, as will be described in more detail below, device 400 includes two input-side IPD assemblies 480, 481, each of which includes portions of an input impedance matching circuit 410, 411 (e.g., circuit 110, 310, 311 FIGS. 1, 3), a baseband decoupling circuit 460, 461 (e.g., circuit 160, FIG. 1), and a harmonic termination circuit 430, 431 (e.g., circuit 130, 330, 331, FIGS. 1, 3). Further, device 400 includes two output-side IPD assemblies 482, 483, each of which includes portions of an output impedance matching circuit 450, 451 (e.g., circuit 150, 350, 351 FIGS. 1, 3), and a baseband decoupling circuit 462, 463 (e.g., circuit 162, FIG. 1).

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for transistor dies 440, 441 and other devices mounted on flange 406. Flange 406 has top and bottom surfaces (only a central portion of the top surface is visible in FIG. 4), and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. Isolation structure 408, which is formed from a rigid, electrically insulating material, provides electrical isolation between conductive features of the device (e.g., between leads 402-405, 492-495 and flange 406). Isolation structure 408 has a frame shape, in an embodiment, which includes a substantially enclosed, four-sided structure with a central opening. Isolation structure 408 may have a substantially rectangular shape, as shown in FIG. 4, or isolation structure 408 may have another shape (e.g., annular ring, oval, and so on).

A portion of the top surface of flange 406 that is exposed through the opening in isolation structure 408 is referred to herein as the "active area" of device 400. Transistor dies 440, 441 are positioned within the active device area of device 400, along with IPD assemblies 480, 481, 482, 483, which will be described in more detail later. For example, the transistor dies 440, 441 and IPD assemblies 480-483 may be coupled to the top surface of flange 406 using conductive epoxy, solder, solder bumps, sintering, and/or eutectic bonds.

Device 400 houses two amplification paths (indicated with arrows 420, 421), where each amplification path 420, 421 represents a physical implementation of circuit 100 (FIG. 1). When incorporated into a Doherty amplifier (e.g., Doherty amplifier 300, FIG. 3), amplification path 420 may correspond to a main amplifier path (e.g., main amplifier path 320, FIG. 3), and amplification path 421 may correspond to a peaking amplifier path (e.g., peaking amplifier path 321, FIG. 3). In some instances, the order could be switched, where amplification path 420 may correspond to a peaking amplifier path, and amplification path 421 may correspond to a main amplifier path.

Each path 420, 421 includes an input lead 402, 403 (e.g., input 102, FIG. 1), an output lead 404, 405 (e.g., output 104, FIG. 1), one or more transistor dies 440, 441 (e.g., transistor 140, FIG. 1 or amplifiers 340, 341, FIG. 3), an input impedance matching circuit 410, 411 (e.g., input impedance matching circuit 110, FIG. 1 or portions of input matching networks 310, 311, FIG. 3), an output impedance matching circuit 450, 451 (e.g., output impedance matching circuit 150, FIG. 1 or portions of output matching networks 350, 351, FIG. 3), an input-side baseband decoupling circuit 460, 461 (e.g., baseband decoupling circuit 160, FIG. 1), an output-side baseband decoupling circuit 462, 463 (e.g., baseband decoupling circuit 162, FIG. 1), an input-side harmonic termination circuit 430, 431 (e.g., harmonic termination circuit 130, 330, 331, FIGS. 1, 3). Some embodiments also may have an output-side harmonic termination circuit (not illustrated).

The input and output leads 402-405 are mounted on a top surface of the isolation structure 408 on opposed sides of the central opening, and thus the input and output leads 402-405 are elevated above the top surface of the flange 406, and are electrically isolated from the flange 406. Generally, the input and output leads 402-405 are oriented to allow for attachment of bondwires between the input and output leads 402-405 and components and elements within the central opening of isolation structure 408.

Each transistor die 440, 441 includes an integrated power FET, where each FET has a control terminal (e.g., a gate terminal) and two current conducting terminals (e.g., a drain terminal and a source terminal). A control terminal of a FET within each transistor die 440, 441 is coupled through an input impedance matching circuit 410, 411 to an input lead 402, 403. In addition, one current conducting terminal (e.g., the drain terminal) of a FET within each transistor die 440, 441 is coupled through an output impedance matching circuit 450, 451 to an output lead 404, 405. The other current conducting terminal (e.g., the source terminal) of a FET within each transistor die 440, 441 is electrically coupled through the die 440, 441 to the flange 406 (e.g., to ground), in an embodiment.

Embodiments of the input impedance matching circuits 410, 411, baseband decoupling circuits 460, 461, and harmonic termination circuits 430, 431 will be described in more detail later in conjunction with FIGS. 5 and 6, which illustrate the components of these circuits 410, 411, 430, 431, 460, 461 in greater detail. As will be explained in conjunction with FIGS. 5 and 6, some of the components of these circuits may be implemented within IPD assemblies 480, 481. Briefly, each input impedance matching circuit 410, 411 is coupled between an input lead 402, 403 and the control terminal of a FET within a transistor die 440, 441. Each input-side baseband decoupling circuit 460, 461 is coupled between a node 415, 416 (e.g., a conductive bond pad) within IPD assembly 480, 481 and a ground reference (e.g., flange 406). Each harmonic termination circuit 430, 431 is coupled between the control terminal (e.g., the gate terminal) of a FET within a transistor die 440, 441 and the ground reference (e.g., flange 406).

Some of the components of the output impedance matching circuits 450, 451 and baseband decoupling circuits 462, 463 may be implemented within IPD assemblies 482, 483. Briefly, each output impedance matching circuit 450, 451 is coupled between a current conducting terminal (e.g., the drain terminal) of a FET within a transistor die 440, 441 and an output lead 404, 405. Each baseband decoupling circuit 462, 463 is coupled between a node 458, 459 (e.g., an RF low-impedance point in the form of a conductive bond pad) within IPD assembly 482, 483 and a ground reference (e.g., flange 406).

In addition to the input and output leads 402-405, device 400 also may include bias circuitry (e.g., including bias circuit 190, FIG. 1). In the embodiment of FIG. 4, each of the bias circuits include an inductive element (e.g., inductive element 192, FIG. 1), and each of the input-side (gate) bias circuits further include a capacitor 496, 497 (e.g., capacitor 196, FIG. 1). For example, each capacitor 496, 497 may be a discrete capacitor with a first terminal coupled to a bias lead 492, 493, and a second terminal coupled to a ground reference node (e.g., on a PCB to which the device 400 is connected).

The inductive element of each bias circuit may include, for example, a series-coupled arrangement of a bias lead 492, 493, 494, 495 and one or more bondwires (e.g., bondwire 592, FIG. 5) coupling each bias lead 492-495 to a control terminal (e.g., the gate terminal) or to a current conducting terminal (e.g., the drain terminal) of a FET within each transistor die 440, 441. The distal end of each bias lead 492-495 may be electrically coupled to an external bias circuit (not shown), which provides a bias voltage to the control terminal or current conducting terminal of each FET through the bias lead 492-495. When the gate bias voltage is provided through bias leads 492, 493, the below-described resistors 522 (e.g., resistor 122, FIG. 1) and capacitor 519 (e.g., capacitor 119, FIG. 1) may be excluded from device 400. In other embodiments, either or both the input-side or output-side bias circuits may be excluded. In such embodiments, the external bias circuits may be connected instead to the input leads 402, 403 or to the output leads 404, 405 and the bias voltage(s) may be provided through the input leads 402, 403 and/or the output leads 404, 405.

In the example of FIG. 4, device 400 includes two transistor dies 440, 441 that essentially function in parallel, although another semiconductor device may include a single transistor die or more than two transistor dies, as well. In addition, device 400 includes two input-side IPD assemblies 480, 481 and two output-side IPD assemblies 482, 483, which also essentially function in parallel. It is to be understood that more or fewer of IPD assemblies 480-483 may be implemented, as well.

According to an embodiment, device 400 is incorporated in an air cavity package, in which transistor dies 440, 441, the IPD assemblies 480-483, and various other components are located within an enclosed air cavity. Basically, the air cavity is bounded by flange 406, isolation structure 408, and a cap (not shown) overlying and in contact with the isolation structure 408 and leads 402-405, 492-495. In FIG. 4, an example interior perimeter of the cap is indicated by dashed box 409, while an exterior perimeter would approximately align with the outer perimeter of flange 406. In other embodiments, the components of device 400 may be incorporated into an overmolded package (i.e., a package in which the electrical components within the active device area are encapsulated with a non-conductive molding compound, and in which portions of the leads 402-405, 492-495 also may be encompassed by the molding compound). In an overmolded package, isolation structure 408 may be excluded.

Figure 5:
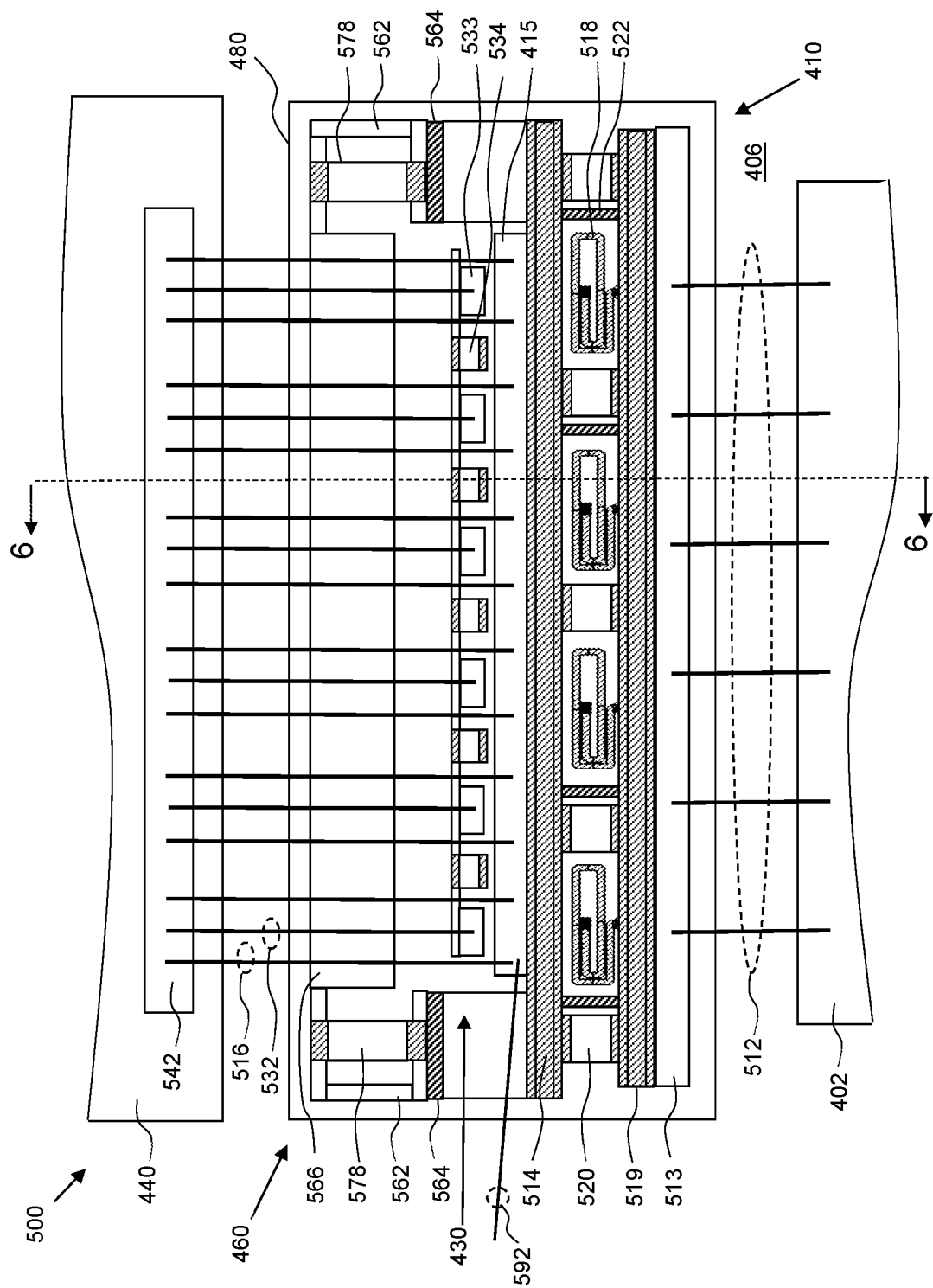
FIG. 5 is a top view of a portion of a packaged RF power amplifier device, including a portion of a power transistor and an input impedance matching circuit, in accordance with an example embodiment.
Figure 6:
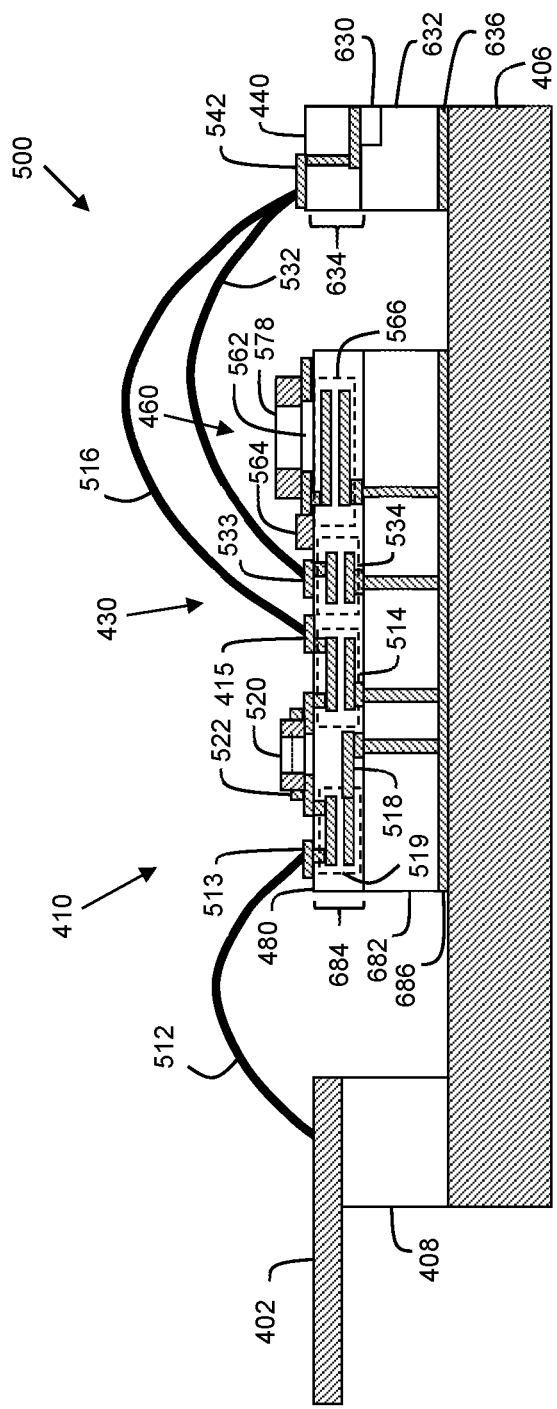
FIG. 6 is a cross-sectional, side view of the portion of the RF power amplifier device of FIG. 5 along line 6-6, in accordance with an example embodiment.

Reference is now made to FIGS. 5 and 6, which include enlarged views of portions of device 400 (FIG. 4) that include embodiments of input impedance matching circuits 410, baseband decoupling circuit 460, and harmonic termination circuit 430. More specifically, FIG. 5 is a top view of the lower-left, input-side portion 500 of packaged RF power amplifier device 400 along amplifier path 420. Portion 500 (FIG. 5) includes a portion of power transistor die 440, a portion of input lead 402, and input-side IPD assembly 480. For enhanced understanding, FIG. 6 includes a cross-sectional, side view of the portion 500 of the RF power amplifier device of FIG. 5 along line 6-6, in accordance with an example embodiment. More specifically, FIG. 6 is a cross-sectional view through input lead 402, IPD assembly 480, a portion of flange 406, and transistor die 440. As indicated in FIG. 6, the power transistor die 440 and the IPD assembly 480 are coupled to the conductive flange 406, and the input lead 402 is electrically isolated from the conductive flange 406 (e.g., using an isolation structure 408). It should be noted that the input-side portion of the device 400 along amplifier path 421 may be substantially the same as portion 500 shown in FIGS. 5 and 6.

The power transistor die 440 includes a transistor input terminal 542 (e.g., a conductive bond pad), which is electrically connected within the power transistor die 440 to a control terminal (e.g., a gate terminal) of a single-stage or final-stage FET 630 integrated within the die 440. As discussed previously, each FET 630 may include a III-V field effect transistor (e.g., a HEMT), such as a GaN FET (or another type of III-V transistor, including a GaAs FET, a GaP FET, an InP FET, or an InSb FET). More specifically, each FET 630 may be integrally formed in and on a base semiconductor substrate 632 (e.g., a GaN substrate, a GaN-on-silicon substrate, a GaN-on-silicon carbide substrate, and so on). Conductive connections between the control terminal of the FET 630 (e.g., the gate terminal) and the input terminal 542 of the die 440 may be made through a build-up structure 634 of alternating dielectric and patterned conductive layers, where portions of the patterned conductive layers are electrically connected using conductive vias. A conductive layer 636 on a bottom surface of the die 440 may provide a ground node (e.g., for the source terminal, which may be connected to the conductive layer 636 (and thus to the conductive flange 406) using through substrate vias or doped sinker regions (not shown)).

The IPD assembly 480 also may include a base semiconductor substrate 682 (e.g., a silicon substrate, a silicon carbide substrate, a GaN substrate, or another type of semiconductor substrate, which may be referred to as an "IPD substrate" herein) and a build-up structure 684 of alternating dielectric and patterned conductive layers, where portions of the patterned conductive layers are electrically connected using conductive vias. As will be discussed in more detail below, various electrical components of the input impedance matching circuit 410, the baseband decoupling circuit 460, and the harmonic termination circuit 430 are integrally formed within and/or connected to the IPD assembly 480. These electrical components may be electrically connected to conductive bond pads (e.g., bond pads 415, 513, 533) at the top surface of the IPD assembly 480, and also may be electrically connected to the conductive flange 406 (e.g., to ground) using through substrate vias to a conductive layer 686 on a bottom surface of the IPD assembly 480.

First, connections between the transistor die 440 and the input lead 402 through the input impedance matching circuit 410 will be described in more detail. More specifically, an input lead 402 is electrically coupled, through an instance of an input impedance matching circuit 410, to the input terminal 542 of the transistor die 440. The input terminal 542, in turn, is electrically coupled to the control terminal (e.g., the gate terminal) of a FET within the transistor die 440.

For example, in an embodiment, the input impedance matching circuit 410 may include three inductive elements 512, 516, 518 (e.g., inductive elements 112, 116, 118, FIG. 1), a series capacitor 520 (e.g., series capacitance 120, FIG. 1), and a shunt capacitor 514 (e.g., shunt capacitance 114, FIG. 1). The first inductive element 512 (e.g., inductive element 112, FIG. 1) may be implemented as a first set of bondwires that are coupled between the input lead 402 and a conductive bond pad 513 (e.g., corresponding to connection node 113, FIG. 1) on a top surface of the IPD assembly 480. The second inductive element 516 (e.g., inductive element 116, FIG. 1) may be implemented as a second set of bondwires that are coupled between bond pad 415 (corresponding to connection node 115, FIG. 1) and the input terminal 542 of the transistor die 440. To avoid cluttering FIG. 5, only one bondwire in the set of bondwires comprising inductive element 516 is circled and numbered with reference number 516. It should be understood that inductive element 516 includes all bondwires coupled between bond pad 415 and the input terminal 542. Finally, the third inductive element 518 (e.g., inductive element 118, FIG. 1) may be implemented as one or more transmission line segments (e.g., coils, as shown) that are integrally formed as part of the IPD assembly 480, and that are electrically coupled between bond pad 513 and a ground reference (e.g., flange 406).

In the illustrated embodiment, a DC blocking capacitor 519 (e.g., DC blocking capacitor 119, FIG. 1) is coupled between the bond pad 513 and the third inductive element 518. However, as described previously, DC blocking capacitor 519 may be excluded when the gate bias voltage is provided through a separate gate bias circuit (e.g., through bias leads 492 and 493). When included, DC blocking capacitor 519 may be implemented as a metal-insulator-metal (MIM) capacitor (or a plurality of parallel-coupled MIM capacitors) that is integrally formed as part of the IPD assembly 480, where a MIM capacitor includes first and second conductive electrodes (formed from patterned portions of the conductive layers of build-up structure 684) that are aligned with each other and electrically separated by dielectric material of the build-up structure 684. Alternatively, DC blocking capacitor 519 may be implemented as one or more discrete capacitors ("chip capacitors") that are connected to a top surface of IPD assembly 480.

A first terminal of the series capacitor 520 (e.g., series capacitance 120, FIG. 1) is coupled directly or indirectly to bond pad 513 (corresponding to corresponding to node 113, FIG. 1), and a second terminal of the series capacitor 520 is coupled directly or indirectly to conductive bond pad 415 (corresponding to corresponding to node 115, FIG. 1). The series capacitor 520 (e.g., series capacitance 120, FIG. 1) may be implemented as a discrete capacitor (or a plurality of parallel-coupled discrete capacitors, as shown in FIG. 4) connected to a top surface of IPD assembly 480. Alternatively, the series capacitor 520 may be implemented as a MIM capacitor (or a plurality of parallel-coupled MIM capacitors) that is integrally formed as part of the IPD assembly 480.

In the illustrated embodiment, one or more resistors 522 (e.g., resistor 122, FIG. 1) are coupled in parallel with capacitor(s) 520. However, as described previously, resistors 522 may be excluded when the gate bias voltage is provided through a separate gate bias circuit (e.g., through bias leads 492 and 493). According to an embodiment, when included, each resistor 522 may be integrally formed as part of the IPD assembly 480. For example, each resistor 522 may be a polysilicon resistor formed from a layer of polysilicon on or within build-up structure 684.

According to an embodiment, a first electrode (or terminal) of the shunt capacitor 514 (e.g., shunt capacitor 114, FIG. 1) is electrically coupled to the conductive bond pad 415 (and thus to capacitor(s) 520 and bondwires 516), and a second electrode (or terminal) of the shunt capacitor 514 is electrically coupled to the conductive flange (e.g., using conductive through substrate vias that extend through the semiconductor substrate 682). The shunt capacitor 514 may be implemented as a MIM capacitor (or a set of parallel-coupled MIM capacitors) that is integrally formed as part of the IPD assembly 480. In a more specific embodiment, the first electrode of the shunt capacitor 514 is "directly connected" to the bond pad 415, where "directly connected" means electrically connected, possibly with one or more conductive traces and/or conductive vias, but without intervening circuit elements (i.e., circuit elements that have more than a trace inductance, where a "trace inductance" is an inductance less than about 100 pH). Because the shunt capacitor 514 and the bond pad 415 are "directly connected," and the bond pad 415 also has only a trace inductance, in an embodiment, the bondwires 516 and the shunt capacitor 514 also may be considered to be "directly connected." In an alternate embodiment, the shunt capacitor 514 may be implemented using one or more discrete capacitors coupled to a top surface of the IPD assembly 480, or using another type of capacitor.

According to an embodiment, bondwires 512 may have an inductance value in a range between about 150 pH to about 400 pH, bondwires 516 may have an inductance value in a range between about 80 pH to about 250 pH, shunt inductor 518 may have an inductance value in a range between about 100 pH to about 350 pH, series capacitor 520 may have a capacitance value in a range between about 25 pF to about 50 pF, resistor 522 may have a resistance value in a range of about 50 ohms to about 150 ohms, and shunt capacitor 514 may have a capacitance value in a range between about 60 pF to about 200 pF. DC blocking capacitor 519 may have a capacitance value in a range of about 50 pF to about 300 pF. In other embodiments, some or all of the above-listed components may have smaller or larger component values than the above-given ranges.

As mentioned above, a baseband decoupling circuit 460 is included in input-side IPD assembly 480, in an embodiment. Each baseband decoupling circuit 460 may have any one of a number of configurations, in various embodiments, such as but not limited to one of the configurations illustrated in FIGS. 2A-2F. In the embodiment illustrated in FIGS. 5 and 6, which corresponds to the baseband decoupling circuit 205 of FIG. 2F, the baseband decoupling circuit 460 includes a series combination of an envelope resistor 564 (e.g., resistor 264, FIG. 2F), an envelope inductor 562 (e.g., inductor 262, FIG. 2F), and an envelope capacitor 566 (e.g., capacitor 266, FIG. 2F) electrically connected between node 415 (e.g., node 115, 215, FIGS. 1, 2F, which may correspond to or be coupled to an RF low-impedance point) and a ground reference (e.g., flange 406). In addition, each baseband decoupling circuit 460 includes a bypass capacitor 578 (e.g., bypass capacitor 278, FIG. 2F) connected in parallel with envelope inductor 562. In the embodiments of FIGS. 5 and 6, two instances of the parallel combination of envelope inductor 562 and bypass capacitor 578 are implemented on opposite sides of the IPD assembly 480. More specifically, the parallel combinations of envelope inductor 562 and capacitor 578 are connected in parallel between envelope resistor 564 and envelope capacitor 566, in the illustrated embodiment. In an alternate embodiment, the baseband decoupling circuit 460 may include only one instance of the combination of envelope inductor 562 and capacitor 578, or more than two instances of the combination of envelope inductor 562 and capacitor 578.

In the embodiment of FIGS. 5 and 6, envelope resistor 564 is integrally formed as part of the IPD assembly 480. For example, each envelope resistor 564 may be a polysilicon resistor formed from a layer of polysilicon on or within build-up structure 684, and electrically coupled between node 418 and the parallel combination of envelope inductor 562 and bypass capacitor 578. In other alternate embodiments, the envelope resistor 564 may be formed from tungsten silicide or another material, may be a thick or thin film resistor, or may be a discrete component coupled to a top surface of IPD assembly 480.

The envelope inductor 562 also may be integrally formed as part of the IPD assembly 480, as is illustrated in the embodiment of FIGS. 5 and 6. For example, each envelope inductor 562 may be a patterned conductor formed from portion(s) of one or more conductive layers of the build-up structure 684, where a first end of the conductor is electrically coupled to envelope resistor 564, and a second end of the conductor is electrically coupled to a first terminal of envelope capacitor 566. In alternate embodiments, each envelope inductor 562 may be implemented as a plurality of bondwires, or as a spiral inductor (e.g., on or proximate to the top surface of IPD assembly 480), or as a discrete inductor coupled to a top surface of IPD assembly 480.

A bypass capacitor 578 is coupled in parallel with each envelope inductor 562, in an embodiment. Each of the bypass capacitors 578 may be, for example, a discrete capacitor that is connected (e.g., using solder, a conductive epoxy, or other means) to a top surface of IPD assembly 480. More specifically, a first terminal of each bypass capacitor 578 may be electrically coupled to the envelope resistor 564 and to a first terminal of an envelope inductor 562, and a second terminal of each bypass capacitor 578 may be connected to a second terminal of an envelope inductor 562 and to a first terminal of envelope capacitor 566.

For example, each bypass capacitor 578 may be a multiple-layer capacitor (e.g., a multiple-layer ceramic capacitor) with parallel, interleaved electrodes and wrap-around end terminations. Alternatively, each bypass capacitor 578 may form a portion of a separate IPD (e.g., a MIM capacitor formed on a semiconductor substrate), or may be a capacitor (e.g., a MIM capacitor) that is integrally formed with the semiconductor substrate of the IPD assembly 480. Alternatively, each bypass capacitor 578 may be implemented as some other type of capacitor capable of providing the desired capacitance for the baseband decoupling circuit 460.

The envelope capacitor 566 is electrically coupled between a ground reference node (e.g., conductive layer 686 at the bottom surface of each IPD assembly 480) and the parallel combination of envelope inductor 562 and bypass capacitor 578. Capacitor 566 may be a MIM capacitor that is integrally formed with the IPD substrate of IPD assembly 480, for example. In some embodiments, capacitor 566 may be formed in the build-up structure 684 entirely above the semiconductor substrate 682, or capacitor 566 may have portions that extend into the semiconductor substrate 682 or are otherwise coupled to, or in contact with, the semiconductor substrate 682. According to an embodiment, the capacitor 566 may be formed from a first electrode, a second electrode, and a dielectric material between the first and second electrodes. The dielectric material of capacitor 566 may include one or more layers of polysilicon, various oxides, a nitride, or other suitable materials. In various embodiments, the first and second electrodes of capacitor 566 may include horizontal portions of conductive layers (e.g., portions that are parallel to the top and bottom surfaces of IPD assembly 480) and/or vertical portions (e.g., portions that are parallel to the sides of IPD assembly 480) of conductive layers that are interconnected. Further, the first and second electrodes of capacitor 566 may be formed from metal layers and/or from conductive semiconductor materials (e.g., polysilicon). Alternatively, each envelope capacitor 566 may be, for example, a discrete capacitor that is connected (e.g., using solder, a conductive epoxy, or other means) to a top surface of the IPD assembly 480. Although particular two-plate capacitor structures are shown in FIG. 6 for capacitors 514, 534, and 566, a variety of other capacitor structures alternatively may be utilized, as would be understood by one of skill in the art based on the description herein.

As discussed previously in conjunction with FIG. 1, a harmonic termination circuit 430 also is connected between the control terminal (e.g., the gate terminal) of a FET within each transistor die 440 and a ground reference (e.g., to the conductive layer 686 on the bottom surface of IPD assembly 480). In the embodiment of FIGS. 5 and 6, the harmonic termination circuit 430 includes a series combination of a shunt inductance 532 (e.g., shunt inductive element 132, FIG. 1) and a shunt capacitor 534 (e.g., shunt capacitance 134, FIG. 1). The shunt inductance 532 may be implemented as a set of bondwires, where first ends of the bondwires are connected to the input terminal 542 of die 440 (and thus to the control terminal of the FET), and second ends of the bondwires are connected to a conductive bond pad 533 that is exposed at a top surface of IPD assembly 480. To avoid cluttering FIG. 5, only one bondwire in the set of bondwires comprising inductive element 532 is circled and numbered with reference number 532, and only one capacitor 534 is numbered in FIG. 5. It should be understood that inductive element 532 includes all bondwires coupled between bond pad 533 and the input terminal 542. Within IPD assembly 480, the bond pad 533 is electrically connected to a first terminal of shunt capacitor 534, and a second terminal of shunt capacitor 534 is electrically connected (e.g., using through substrate vias) to the ground reference (e.g., to the conductive layer 686 on the bottom surface of IPD assembly 480).

According to an embodiment, the shunt capacitor 534 of harmonic termination circuit 430 may be implemented as a capacitor that is integrally formed with the IPD substrate of the IPD assembly 480. For example, shunt capacitor 534 may be implemented as an integrated MIM capacitor, which includes first and second conductive electrodes (formed from patterned portions of the conductive layers of build-up structure 684) that are aligned with each other and electrically separated by dielectric material of the build-up structure 684. A first electrode (or terminal) of the shunt capacitor 534 is electrically coupled to the conductive bond pad 533, and a second electrode (or terminal) of the shunt capacitor 534 is electrically coupled to the conductive flange 406 (e.g., using through substrate vias), in an embodiment. In a more specific embodiment, the first electrode of the shunt capacitor 534 is "directly connected" (as defined previously) to the bond pad 533. Because the shunt capacitor 534 and the bond pad 533 are "directly connected," and the bond pad 533 also has only a trace inductance, in an embodiment, the bondwires 532 and the shunt capacitor 534 also may be considered to be "directly connected." In an alternate embodiment, the shunt capacitor 534 may be implemented using a discrete capacitor coupled to a top surface of the IPD assembly 480, or using another type of capacitor.

According to an embodiment, the harmonic termination circuit 430 functions as low impedance path to ground for signal energy at a harmonic frequency (e.g., a second harmonic of a fundamental frequency of operation of device 400). More specifically, the component values for the shunt inductance 532 and the shunt capacitance 534 are selected so that the series combination of the shunt inductance 532 and shunt capacitance 534 resonate at or near the second harmonic frequency. For example, the fundamental frequency of operation of device 400 may be in a range of about 800 megahertz (MHz) to about 6.0 gigahertz (GHz), and thus the second harmonic frequency (and resonant frequency of circuit 430) may be in a range of about 1.6 GHz to about 12.0 GHz. According to an embodiment, inductance 532 may have an inductance value in a range between about 80 pH to about 1 nH, and capacitor 534 may have a capacitance value in a range between about 1 pF to about 100 pF, although these components may have values outside of these ranges, as well. As discussed above in conjunction with FIG. 1, for example, at a fundamental frequency of operation of 2.0 GHz, which has a second harmonic at 4.0 GHz, inductance 532 may have an inductance value of about 120 pH, and capacitor 534 may have a capacitance value of about 12 pF. However, the designed inductance and/or capacitance values may be affected by mutual coupling between bondwires used to implement inductances 516, 532.

More specifically, and according to an embodiment, the bondwires corresponding to inductive elements 516 and 532 are physically configured and arranged, with respect to each other, to exhibit a predictable mutual coupling between adjacent sets of bondwires during operation. More specifically, the bondwire profiles (e.g., the heights and shapes of each set of bondwires) and their proximities to other bondwires result in predictable mutual coupling, during operation, that results in different effective inductance values of the inductive elements 516 and 532, during operation, than the self-inductance values of the inductive elements 516 and 532 when each inductance is taken in isolation (i.e., not affected by mutual inductance from other inductances).

As also discussed previously, a bias circuit (e.g., bias circuit 190, FIG. 1) also may be coupled to the control terminal (e.g., gate terminal) of the transistor 630, and in one embodiment, this connection is made through the IPD assembly 480. More particularly, in an embodiment, the first end of at least one bondwire 592 also may be connected to the conductive bond pad 415, and the second end of bondwire 592 is connected to a bias lead (e.g., bias lead 492, FIG. 4). When a bias voltage is provided by an external bias circuit to the bias lead, the bias voltage may be conveyed through bondwires 592, conductive landing pad 415, bondwires 516, and conductive landing pad 542 to the gate terminal of the FET within transistor die 440. According to an embodiment, the series combination of bondwire 592 and the bias lead (e.g., bias lead 492, FIG. 4) may have an inductance value in a range between about 500 pH to about 3000 pH, although the inductance value could be lower or higher, as well.

FIGS. 4-6 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

Figure 7:
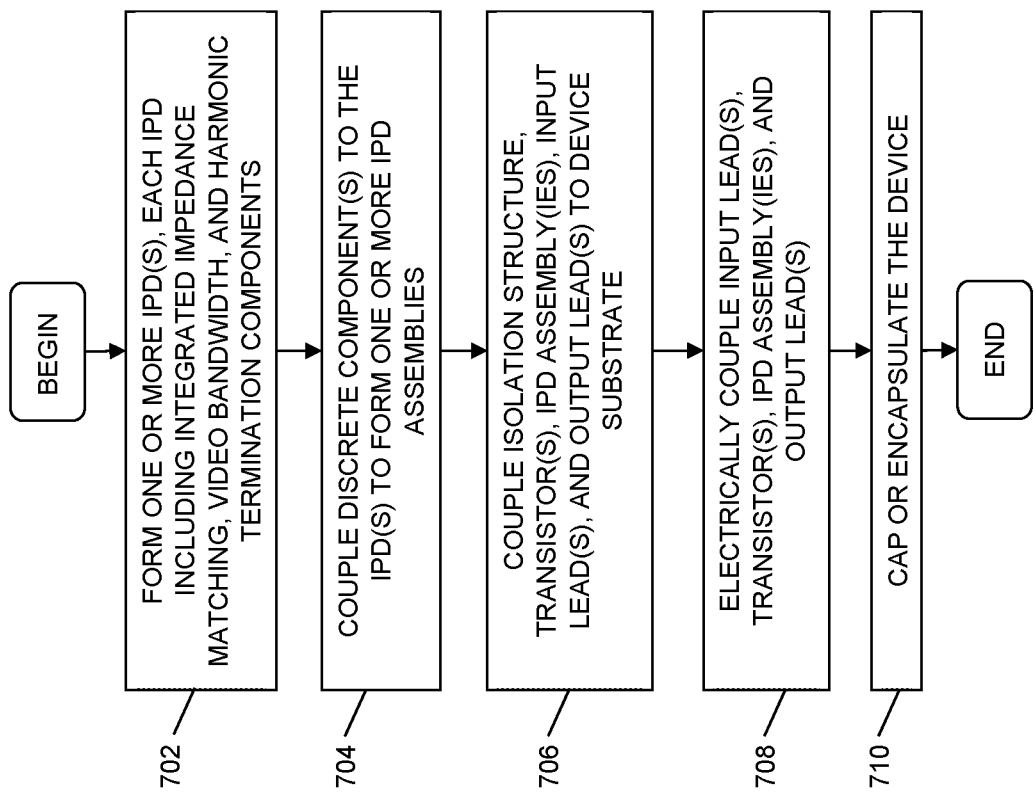
FIG. 7 is a flowchart of a method for fabricating a packaged RF power amplifier device that includes an embodiment of an input impedance matching circuit, in accordance with an example embodiment.

FIG. 7 is a flowchart of a method for fabricating a packaged RF power amplifier device (e.g., device 400, FIG. 4) that includes embodiments of input and output impedance matching circuits, input-side and output-side baseband decoupling circuits, and input-side harmonic termination circuits (e.g., circuits 200-205, 410, 411, 430, 431, 450, 451, 460-463, FIGS. 2A-2F, 4), in accordance with various example embodiments. The method may begin, in blocks 702-704, by forming one or more IPD assemblies. More specifically, in block 702, one or more input and output IPDs (e.g., IPD 480-483, FIGS. 4-6) may be formed. According to an embodiment, each input IPD (e.g., IPDs 480, 481) includes components of an impedance matching circuit, a baseband decoupling circuit, and a harmonic termination circuit. For example, each input IPD may include one or more integrated series capacitors (e.g., capacitors 120, 520, FIGS. 1, 5, 6), one or more integrated shunt capacitors (e.g., capacitors 114, 119, 134, 266, 514, 519, 534, 566, FIGS. 1, 2, 5, 6), one or more inductive elements (e.g., inductive elements 118, 262, 518, 562, FIGS. 1, 2, 5, 6), and one or more resistors (e.g., resistors 122, 264, 522, 564, FIGS. 1, 2, 5, 6). As mentioned previously, components associated with DC biasing through the input terminal (e.g., capacitor 119, 519 and resistor 122, 522, FIGS. 1, 5) may be excluded in embodiments in which biasing is provided through a bias lead. According to an embodiment, each output IPD (e.g., IPDs 482, 483) also includes components of an impedance matching circuit, and a baseband decoupling circuit. In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes at a surface of each IPD substrate. As discussed previously, the connection nodes may include conductive bond pads, which may accept attachment of inductive elements (e.g., bondwires 512, 516, 532, FIGS. 5, 6). In addition, in block 704, when some components corresponding to various circuit elements (e.g., capacitors 520, 578, FIGS. 5, 6) are implemented as discrete components (rather than integrated components), those discrete components may be coupled to conductors exposed at the surface of each IPD to form one or more IPD assemblies.

In block 706, for an air cavity embodiment, an isolation structure (e.g., isolation structure 408, FIG. 4) is coupled to a device substrate (e.g., flange 406). In addition, one or more active devices (e.g., transistors 440, 441) and IPD assemblies (e.g., IPD assemblies 480-483) are coupled to a portion of the top surface of the substrate that is exposed through an opening in the isolation structure. Leads (e.g., input and output leads 402-405, and bias leads 492-495, if included) are coupled to the top surface of the isolation structure. For overmolded (e.g., encapsulated) device embodiments, the isolation structure may be excluded, and the substrate and leads may form portions of a leadframe.

In block 708, the input lead(s), transistor(s), IPD assembly(ies), and output lead(s) are electrically coupled together. For example, the electrical connections may be made using bondwires between the various device components and elements, as discussed previously. Some of the bondwires correspond to inductive components of input or output matching circuits (e.g., bondwires 512, 516, FIGS. 4-6), and harmonic termination circuits (e.g., bondwires 532, FIGS. 4-6), for example. Finally, in block 710, the device is capped (e.g., for an air cavity package) or encapsulated (e.g., with mold compound for an overmolded package). The device may then be incorporated into a larger electrical system (e.g., a Doherty amplifier or other type of electrical system).

An embodiment of an RF amplifier includes a transistor die with a transistor and a transistor input terminal, a multiple-section bandpass filter circuit, and a harmonic termination circuit. The multiple-section bandpass filter circuit is coupled between a first input of a first amplification path and the transistor input terminal, and the multiple-section bandpass filter circuit includes a first connection node coupled to the first input, a first inductive element coupled between the first connection node and a ground reference node, a second connection node, a first capacitance coupled between the first connection node and the second connection node, a second capacitance coupled between the second connection node and the ground reference node, and a second inductive element coupled between the second connection node and the transistor input terminal. The harmonic termination circuit includes a third inductive element and a third capacitance connected in series between the transistor input terminal and the ground reference node. The harmonic termination circuit resonates at a harmonic frequency of a fundamental frequency of operation of the RF amplifier.

An embodiment of a packaged RF amplifier device includes a device substrate, input and output leads coupled to the device substrate, a transistor die coupled to the device substrate, and a multiple-section bandpass filter circuit coupled the input lead and the transistor input terminal. The transistor die includes a transistor, a transistor input terminal coupled to the input lead, and a transistor output terminal coupled to the output lead. The multiple-section bandpass filter circuit includes a first connection node coupled to the input lead, a first inductive element coupled between the first connection node and a ground reference node, a second connection node, a first capacitance coupled between the first connection node and the second connection node, a second capacitance coupled between the second connection node and the ground reference node, and a second inductive element coupled between the second connection node and the transistor input terminal. The packaged RF amplifier also includes a harmonic termination circuit that includes a third inductive element and a third capacitance connected in series between the transistor input terminal and the ground reference node. The harmonic termination circuit resonates at a harmonic frequency of a fundamental frequency of operation of the packaged RF amplifier device.

An embodiment of a method of manufacturing an RF amplifier device includes coupling an input lead and an output lead to a device substrate, coupling a transistor die to the device substrate between the input and output leads, coupling a multiple-section bandpass filter circuit between the input lead and the transistor input terminal, and coupling a harmonic termination circuit between the transistor input terminal and a ground reference node. The transistor die includes a transistor and a transistor input terminal. The multiple-section bandpass filter circuit includes a first connection node coupled to the input lead, a first inductive element coupled between the first connection node and a ground reference node, a second connection node, a first capacitance coupled between the first connection node and the second connection node, a second capacitance coupled between the second connection node and the ground reference node, and a second inductive element coupled between the second connection node and the transistor input terminal. The harmonic termination circuit includes a third inductive element and a third capacitance connected in series. The harmonic termination circuit resonates at a harmonic frequency of a fundamental frequency of operation of the packaged RF amplifier device.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier comprising:
   a transistor die with a transistor and a transistor input terminal;
   a multiple-section bandpass filter circuit coupled between
       a first input of a first amplification path and the transistor input terminal, wherein the multiple-section bandpass filter circuit includes
       a first connection node coupled to the first input,
       a first shunt inductive element coupled between the first connection node and a ground reference node,
       a second connection node,
       a first series capacitance coupled between the first connection node and the second connection node,
       a second shunt capacitance coupled between the second connection node and the ground reference node, and
       a second series inductive element with a first terminal connected to the second connection node, and a second terminal coupled to the transistor input terminal; and
   a harmonic termination circuit comprising a third inductive element and a third capacitance connected in series between the transistor input terminal and the ground reference node, wherein the harmonic termination circuit resonates at a harmonic frequency of a fundamental frequency of operation of the RF amplifier.

2. The RF amplifier of claim 1, wherein the transistor is a gallium nitride transistor.

3. The RF amplifier of claim 1, wherein:
   the second series inductive element comprises a first plurality of bondwires; and
   the third inductive element comprises a second plurality of bondwires.

4. The RF amplifier of claim 1, wherein the input-side harmonic termination circuit resonates at a second harmonic frequency of the fundamental frequency of operation.

5. The RF amplifier of claim 1, wherein the input circuit further comprises a fourth inductive element coupled between the first input and the first connection node, wherein the fourth inductive element comprises a plurality of bondwires.

6. The RF amplifier of claim 1, further comprising:
   a second amplification path;
   a power divider with a power divider input configured to receive an RF signal, a first output coupled to the first input of the first amplification path, and a second output coupled to a second input of the second amplification path, wherein the power divider is configured to divide the RF signal into a first RF signal that is provided to the first amplification path through the first output, and into a second RF signal that is provided to the second amplification path through the second output; and
   a combining node configured to receive and combine amplified RF signals produced by the first and second amplification paths.

7. The RF amplifier of claim 6, wherein the RF amplifier is a Doherty power amplifier.

8. A radio frequency (RF) amplifier comprising:
   a transistor die with a transistor and a transistor input terminal;
   a multiple-section bandpass filter circuit coupled between
       a first input of a first amplification path and the transistor input terminal, wherein the multiple-section bandpass filter circuit includes
       a first connection node coupled to the first input,
       a first inductive element coupled between the first connection node and a ground reference node,
       a second connection node,
       a first capacitance coupled between the first connection node and the second connection node,
       a second capacitance coupled between the second connection node and the ground reference node, and
       a second inductive element coupled between the second connection node and the transistor input terminal;
   a harmonic termination circuit comprising a third inductive element and a third capacitance connected in series between the transistor input terminal and the ground reference node, wherein the harmonic termination circuit resonates at a harmonic frequency of a fundamental frequency of operation of the RF amplifier; and
   a baseband decoupling circuit coupled between the second connection node and the ground reference node, wherein the baseband decoupling circuit includes a plurality of components, wherein the plurality of components includes an envelope resistor, an envelope inductor, and an envelope capacitor coupled in series between the connection node and the ground reference node.

9. The RF amplifier of claim 8, wherein the baseband decoupling circuit further includes a bypass capacitor coupled in parallel across one or more of the plurality of components of the baseband decoupling circuit.

10. The RF amplifier of claim 9, wherein the bypass capacitor is coupled in parallel across the envelope inductor, and wherein the envelope inductor and the bypass capacitor form a parallel resonant circuit in proximity to a center operating frequency of the RF amplifier.

11. A radio frequency (RF) amplifier comprising:
    a transistor die with a transistor and a transistor input terminal;
    a multiple-section bandpass filter circuit coupled between
        a first input of a first amplification path and the transistor input terminal, wherein the multiple-section bandpass filter circuit includes
        a first connection node coupled to the first input,
        a first inductive element coupled between the first connection node and a ground reference node,
        a second connection node,
        a first capacitance coupled between the first connection node and the second connection node,
        a second capacitance coupled between the second connection node and the ground reference node, and
        a second inductive element coupled between the second connection node and the transistor input terminal;
    a harmonic termination circuit comprising a third inductive element and a third capacitance connected in series between the transistor input terminal and the ground reference node, wherein the harmonic termination circuit resonates at a harmonic frequency of a fundamental frequency of operation of the RF amplifier;
    a resistor coupled in parallel with the first capacitance between the first and second connection nodes; and a DC blocking capacitor coupled in series with first inductive element coupled between the first connection node and a ground reference node.

12. A packaged radio frequency (RF) amplifier device comprising:
   a device substrate;
   an input lead coupled to the device substrate;
   an output lead coupled to the device substrate;
   a transistor die coupled to the device substrate, wherein the transistor die includes a transistor, a transistor input terminal coupled to the input lead, and a transistor output terminal coupled to the output lead;
   a multiple-section bandpass filter circuit coupled to the input lead and the transistor input terminal, wherein the multiple-section bandpass filter circuit includes
      a first connection node coupled to the input lead,
      a first shunt inductive element coupled between the first connection node and a ground reference node,
      a second connection node,
      a first series capacitance coupled between the first connection node and the second connection node,
      a second shunt capacitance coupled between the second connection node and the ground reference node, and
      a second series inductive element with a first terminal connected to the second connection node, and a second terminal coupled to the transistor input terminal; and
   a harmonic termination circuit comprising a third inductive element and a third capacitance connected in series between the transistor input terminal and the ground reference node, wherein the harmonic termination circuit resonates at a harmonic frequency of a fundamental frequency of operation of the packaged RF amplifier device.

13. The packaged RF amplifier device of claim 12, further comprising:
   an integrated passive device coupled to the device substrate, wherein the first shunt inductive element, the first series capacitance, and the second shunt capacitance are integrally formed with or connected to the integrated passive device.

14. The packaged RF amplifier device of claim 12, further comprising:
   an integrated passive device coupled to the device substrate, wherein at least some of the components of the multiple-section bandpass filter are integrally formed with or connected to the integrated passive device, and wherein the second series inductive element comprises a first plurality of bondwires connected between the integrated passive device and the transistor die.

15. The packaged RF amplifier device of claim 14, wherein:
   the third capacitance is integrally formed with or connected to the integrated passive device; and
   the third inductive element and comprises a second plurality of bondwires connected between the integrated passive device and the transistor die.

16. A method of manufacturing an RF amplifier device, the method comprising the steps of:
   coupling an input lead to a device substrate;
   coupling an output lead to the device substrate;
   coupling a transistor die to the device substrate between the input and output leads, wherein the transistor die includes a transistor and a transistor input terminal;
   coupling a multiple-section bandpass filter circuit between the input lead and the transistor input terminal, wherein the multiple-section bandpass filter circuit includes
      a first connection node coupled to the input lead,
      a first shunt inductive element coupled between the first connection node and a ground reference node,
      a second connection node,
      a first series capacitance coupled between the first connection node and the second connection node,
      a second shunt capacitance coupled between the second connection node and the ground reference node, and
      a second series inductive element with a first terminal connected to the second connection node, and a second terminal coupled to the transistor input terminal; and
   coupling a harmonic termination circuit between the transistor input terminal and the ground reference node, wherein the harmonic termination circuit includes a third inductive element and a third capacitance connected in series, and the harmonic termination circuit resonates at a harmonic frequency of a fundamental frequency of operation of the packaged RF amplifier device.

17. The method of claim 16, wherein:
   coupling the multiple-section bandpass filter circuit between the input lead and the transistor input terminal includes
      coupling an integrated passive device to the device substrate between the transistor die and the input lead, wherein the first integrated passive device includes the first shunt inductive element, the first series capacitance, the second shunt capacitance, and the first and second connection nodes in the form of first and second bond pads,
      coupling a fourth inductive element between the input lead and the first connection node by coupling a first plurality of bondwires between the input lead and the first connection node, and
      coupling the second series inductive element between the second connection node and the transistor input terminal by coupling a second plurality of bondwires between the second connection node and the transistor input terminal;
   the integrated passive device further includes the third capacitance; and
   coupling the harmonic termination circuit between the transistor input terminal and the ground reference node includes coupling a third plurality of bondwires between the transistor input terminal and the third capacitance.

18. A method of manufacturing an RF amplifier device, the method comprising the steps of:
   coupling an input lead to a device substrate;
   coupling an output lead to the device substrate;
   coupling a transistor die to the device substrate between the input and output leads, wherein the transistor die includes a transistor and a transistor input terminal;
   coupling a multiple-section bandpass filter circuit between the input lead and the transistor input terminal, wherein the multiple-section bandpass filter circuit includes
      a first connection node coupled to the input lead,
      a first inductive element coupled between the first connection node and a ground reference node,
      a second connection node, a first capacitance coupled between the first connection node and the second connection node, a second capacitance coupled between the second connection node and the ground reference node, and a second inductive element coupled between the second connection node and the transistor input terminal;

coupling a harmonic termination circuit between the transistor input terminal and the ground reference node, wherein the harmonic termination circuit includes a third inductive element and a third capacitance connected in series, and the harmonic termination circuit resonates at a harmonic frequency of a fundamental frequency of operation of the packaged RF amplifier device; and coupling a baseband decoupling circuit between the second connection node and the ground reference node, wherein the baseband decoupling circuit includes a plurality of components, wherein the plurality of components includes an envelope resistor, an envelope inductor, and an envelope capacitor coupled in series between the connection node and the ground reference node.

19. The method of claim 18, wherein:

coupling the multiple-section bandpass filter circuit between the input lead and the transistor input terminal includes coupling an integrated passive device to the device substrate between the transistor die and the input lead, wherein the first integrated passive device includes the first inductive element, the first capacitance, the second capacitance, the envelope resistor, the envelope inductor, and the envelope capacitor.

20. The method of claim 16, wherein:

coupling the harmonic termination circuit between the transistor input terminal and the ground reference node includes coupling a third plurality of bondwires between the transistor input terminal and the third capacitance.

* * * * *